United States Patent [19]

Anjum

[11] Patent Number: 5,633,177

[45] Date of Patent: *May 27, 1997

[54] METHOD FOR PRODUCING A SEMICONDUCTOR GATE CONDUCTOR HAVING AN IMPURITY MIGRATION BARRIER

[75] Inventor: Mohammed Anjum, Austin, Tex.

[73] Assignee: Advanced Micro Devices, Inc., Sunnyvale, Calif.

[*] Notice: The term of this patent shall not extend beyond the expiration date of Pat. No. 5,393,676.

[21] Appl. No.: 194,985

[22] Filed: Nov. 8, 1993

[51] Int. Cl.$^6$ ............................................. H01L 21/265
[52] U.S. Cl. ........................... 438/301; 438/306; 438/528
[58] Field of Search ...................... 437/24, 41, 29

[56] References Cited

U.S. PATENT DOCUMENTS

| | | | |
|---|---|---|---|
| 4,558,507 | 12/1985 | Okabayashi et al. | 437/200 |
| 4,636,822 | 1/1987 | Codella et al. | 437/44 |
| 4,683,645 | 8/1987 | Naguib et al. | 437/24 |
| 4,728,619 | 3/1988 | Pfiester | 437/34 |
| 4,830,971 | 5/1989 | Shibata | 437/29 |
| 4,835,112 | 5/1989 | Pfiester et al. | |
| 4,855,246 | 8/1989 | Codella et al. | 437/44 |
| 5,108,954 | 4/1992 | Sandhu et al. | |
| 5,126,278 | 6/1992 | Kodaira | 437/24 |
| 5,137,838 | 8/1992 | Ramde et al. | 437/24 |
| 5,266,510 | 11/1993 | Lee | 437/24 |
| 5,296,386 | 3/1994 | Aronowitz et al. | 437/24 |
| 5,298,435 | 3/1994 | Aronowitz et al. | 437/24 |
| 5,312,766 | 5/1994 | Aronowitz et al. | 437/24 |
| 5,393,676 | 2/1995 | Anjum | 437/41 |
| 5,426,069 | 6/1995 | Selvakumar et al. | 437/24 |
| 5,470,794 | 11/1995 | Anjum et al. | 437/200 |

OTHER PUBLICATIONS

Baker et al., "The Influence of Flourine on Threshold Voltage Instabilities in P+ Polysilicon gated P-Channel MOSFETs", *IEDM*, (1989), pp. 443–446.

Yoon et al., "MOS Characteristics of $NH_3$-Nitrided $N_2O$-Grown Oxides", *IEEE*, (1993), pp. 179–181.

Sung et al., "Fluorine Effect on Boron Diffusion of P+ Gate Devices", *IEEE*, (1989), pp. 447–450.

*Primary Examiner*—George Fourson
*Assistant Examiner*—Scott Kirkpatrick
*Attorney, Agent, or Firm*—Kevin L. Daffer; Conley, Rose & Tayon

[57] ABSTRACT

A PMOS device is provided having a diffusion barrier placed within the polysilicon gate. The diffusion barrier is purposefully deposited to a concentration peak density within the gate which is deeper than subsequently placed impurity dopant. The barrier comprises germanium atoms placed in fairly close proximity to one another within the gate conductor, and the impurity dopant comprises an ionized compound of $BF_2$ subsequently placed as boron within the gate and source/drain region, at least a majority and preferably greater than eighty percent of which are placed shallower within the gate than the germanium atoms. The barrier region substantially prevents or retards penetration of boron atoms through the gate oxide and into the channel region. Thus, the barrier helps prevent change in channel concentration and problems associated with boron penetration such as flatband voltage (Vfb) and threshold voltage (Vth) shift.

15 Claims, 3 Drawing Sheets

METHOD FOR PRODUCING A SEMICONDUCTOR GATE CONDUCTOR HAVING AN IMPURITY MIGRATION BARRIER

BACKGROUND OF THE INVENTION

1. Field of the Invention

This invention relates to semiconductor processing and more particularly to a semiconductor gate conductor having an impurity diffusion barrier and method for producing the same.

2. Background of the Relevant Art

Fabrication of a MOS device generally begins with a bulk silicon substrate having one or more wells of opposite dopant polarity placed within the substrate. Source and drain regions are then diffused or implanted into the substrate and well areas such that the source and drain regions are of opposite dopant polarity than the well or substrate. Accordingly, a complementary MOS, or CMOS, device can be formed having both n-channel and p-channel active devices or field effect transistors (FETs).

Very large scale integration (VLSI) processing dictates that active devices be placed close to one another in a dense fashion. As such, source and drain regions are often implanted or diffused at very shallow depths. Moreover, the spacing between the source and drain regions, or channel length, is oftentimes less than a few microns, and in some instances less than one micron. To ensure that the source and drain regions substantially maintain their original shape (i.e., do not continue to out-diffuse deeper or wider than a target amount), it is sometimes imperative that closely spaced devices have a diffusion barrier placed within the source/drain regions. U.S. Pat. No. 4,835,112 (incorporated herein by reference) utilizes a germanium barrier to retard or substantially prevent diffusion of the source/drain regions beyond an initial target amount. Germanium ions are implanted into the source/drain regions along with the n+ or p+ dopants, phosphorous or boron, respectively. As taught in Patent '112, germanium, used as a barrier, retards lateral diffusion and reduces many problems associated therewith, including lessening of hot carrier injection and reducing the amount of shrinkage in the effective channel length (Leff) of the active device.

Implantation of germanium ions into the source/drain region can also help reduce contact resistance between the source/drain material and overlying silicide. See, e.g., U.S. Pat. No. 5,108,954 (incorporated herein by reference). Patent '954 utilizes germanium within the source/drain to retard or substantially prevent diffusion of dopant material from the source/drain to the silicide at the immediate juncture between the silicide and source/drain. Germanium is used to prevent a void caused by diffusivity of conductivity enhancing dopant at the juncture, and to prevent loss of conductivity as a result of that void. Consequently, source/drain regions utilizing a germanium barrier near the silicide can provide and maintain a better ohmic contact between an overlying metallization layer and the source/drain.

While it is important to maintain precise source/drain diffusion geometry and low resistance contact thereto, it is also important that the diffusion impurity chosen not adversely affect the channel region concentration. Specifically, recent studies indicate a problem associated with p-channel MOS (PMOS) FET manufacture, whereby p+ dopant of boron from a boron difluoride ($BF_2$) carrier will penetrate, diffuse, or migrate through the thin gate oxide from the gate conductor to the underlying channel region. See, e.g., Sung, et al., "Fluorine Effect on Boron Diffusion of P+ Gate Devices," *IEDM* (1989), pp. 447–450. The channel region must maintain closely controlled n– dopant level generally set by the substrate manufacturer. Generally speaking, a PMOS device is manufactured using a self-aligned process having source and drain regions implanted simultaneous with the gate conductor (such as polycrystalline silicon or "polysilicon"), wherein the gate conductor is configured over the channel region between the source and drain. Not only must the lateral diffusions be minimized and controlled as described above, but also the diffusion of p+impurities through the thin gate oxide via the polysilicon gate must also be minimized and controlled. As defined herein, "conductive material" or "gate conductor" refers to undoped polysilicon which becomes conductive after impurity implant and anneal.

It has been recently discovered that titanium silicide deposited on the upper surface of the gate prior to dopant introduction will substantially block boron difluoride ($BF_2$) from being implanted into the gate. Absence of boron or $BF_2$ in the gate will therefore ensure that it will not subsequently enter the channel via the gate during anneal. See, e.g., Baker et al., "The Influence of Fluorine on Threshold Voltage Instabilities in P+ Polysilicon gated P-Channel MOSFETs," *IEDM*, (1989), pp. 443–446. As described in Baker, et al., boron introduction into the channel region, derived from the boron fluoride, causes a change in the concentration level of the n– channel substrate. Slight change in channel concentration will cause a shift in threshold voltage, Vth, and flatband voltage, Vfb, of the operating device. An alternative solution to preventing boron penetration proposed by Baker et al., is to use elemental boron instead of boron fluoride ($BF_2$). However, it is well known that fluorine is a beneficial carrier in PMOS diffusion areas and remains a mainstay in PMOS fabrication.

Titanium silicide placed across the upper gate area prior to dopant implantation provides the user with the benefits of $BF_2$ and appears to solve the $BF_2$ penetration problem. However, titanium silicide selectively placed across only the gate region prior to source/drain implantation generally requires a separate masking step and associated photolithography. The masking step must eventually be repeated in order to provide a high conductivity silicide over the source/drain contact regions after the source/drain areas are implantated. Requiring two photolithography steps and associated masks can prove problematic and should in most cases be avoided if only one step is needed. Alternatively, titanium silicide can be placed across the entire active area (gate and source/drain regions) prior to a high energy implantation through the silicide. Blanket deposition of titanium silicide in the active regions follows normal processing flow without requiring additional masks or steps. However, blanket deposition and subsequent high energy implantation cannot ensure $BF_2$ is prevented from entering the gate while permitting accurate (e.g., shallow) implantation into the source/drain.

SUMMARY OF THE INVENTION

The problems outlined above are in large part solved by the improved semiconductor gate of the present invention. That is, the gate conductor hereof utilizes a germanium barrier placed at a specific depth within the gate material only, such that the barrier will substantially prevent or retard penetration or migration of subsequently introduced boron dopant (from a $BF_2$ implant) from the gate conductor to the underlying channel. Separate masks and/or processing steps are not needed. Germanium ions can be blanket implanted across the entire wafer surface subsequent to polysilicon deposition without requiring any special photolithography steps. After photoresist and etch, germanium implanted gate material is then ready to accept normal dopant introduction into the active regions. Thus, the only change in the normal processing flow is the non-masked introduction of germanium into the polysilicon-coated wafer. Blanket germanium implantation, however, can be more easily achieved and more accurately defined than select implantation through implant windows. After germanium implantation, the polysilicon is patterned and active areas (polysilicon gate and source/drain regions) are subsequently doped identical to a normal processing flow.

The germanium ions are implanted into the conductive material of the gate to a deeper depth than the subsequently placed $BF_2$ ions. As such, germanium forms a barrier only within a pre-defined gate conductor, and the barrier exists between a substantial majority of dopant ions and the underlying gate oxide and channel. Germanium barrier will therefore substantially block the migration or reduce the diffusivity of $BF_2$ ions into the underlying channel from their original shallow polysilicon implant position. Since source/drains are normally shallow implanted, simultaneous shallow implant into the gate conductor is easily and naturally obtained in one processing step.

Broadly speaking, the present invention contemplates a method for reducing the diffusion of dopant from a patterned semiconductor gate conductor to an underlying channel region. The method comprises the steps of providing a semiconductor substrate and a first layer of dielectric material (thin gate oxide) across one surface of the substrate. A conductive material (i.e., polysilicon gate material which later becomes conductive) is also provided across the dielectric material wherein the conductive material has an upper and lower surface, and the upper surface is exposed while the lower surface is configured adjacent to the dielectric material gate oxide. Next, germanium is implanted into the conductive material to a concentration peak density at a first depth relative to the upper surface of the conductive material. Portions of the conductive material are removed to present a patterned gate conductor, a source region, and a drain region. The source and drain regions are spaced apart within the substrate by a channel region underlying the patterned gate conductor. A dopant material is then implanted into the source and drain regions simultaneous with dopant material implanted into the patterned conductor. The dopant material placed within the conductor is implanted to a concentration peak density at a second depth, and the second depth is shallower than the first depth. A metal can then be applied to the patterned gate conductor and the source and drain regions. Thereafter, a second layer of dielectric material such as PSG or BPSG can be deposited in liquid form across the metal and the patterned gate conductor. The second layer of dielectric material can then be cured at a temperature sufficient to anneal the patterned gate conductor and form silicide at a juncture between the metal and the patterned gate conductor, between the metal and the source region, and between the metal and the drain region.

The present invention further contemplates a semiconductor fabrication process utilizing only PMOS technology and is specifically suitable for PMOS FET device manufacture. That is, the semiconductor is a n- type substrate or well and the dopant material is a p+ impurity consisting of $BF_2$-derived dopant (or boron). Concentration peak densities implanted at various depths are obtained using varying implant energies from a conventional ion implanter. For example, for a patterned gate conductor of approximately 4000 Å, the first depth is preferably around 1030 Å at a germanium dose within the range of $1 \times 10^{15}$–$5 \times 10^{14}$ atoms/$cm^2$, and at an implant energy greater than 150 keV. The second depth can be approximately 500 Å at a $BF_2$ dose within the range of $3 \times 10^{15}$–$8 \times 10^{15}$ atoms/$cm^2$, and at an implant energy at or less than 60 keV.

BRIEF DESCRIPTION OF THE DRAWINGS

Other objects and advantages of the invention will become apparent upon reading the following detailed description and upon reference to accompanying drawings in which.

Figure 1:
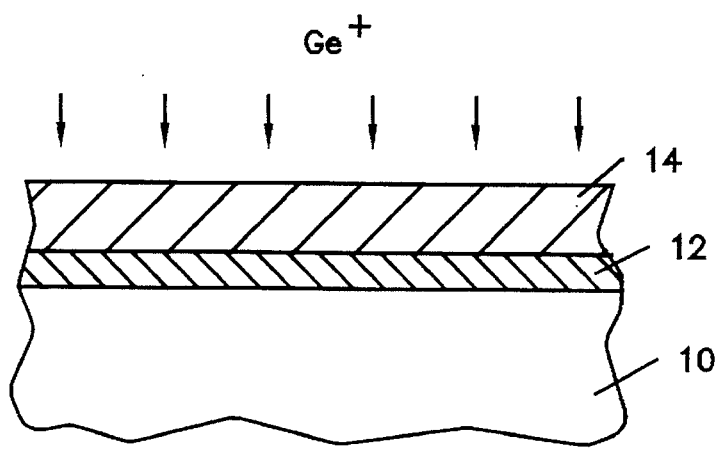
FIG. 1 is a cross-sectional view of a semiconductor substrate with dielectric oxide and overlying conductive material configured to receive Ge ions during a processing step according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but only the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a semiconductor substrate 10 suitable for producing a PMOS device according to the present invention. Substrate 10 is implanted (or doped) with impurities in order to achieve an n- starting material necessary for receiving opposite doped p+ source and drain diffusions. A dielectric material 12 is placed across one surface of substrate 10 as shown. Dielectric material 12 is an oxide and is relatively thin in order to suffice as a thin gate oxide of common design. Dielectric 12 is grown according to conventional thermal oxidation procedures whereby less than 100 angstroms (Å) of oxide can be grown on the exposed surface of silicon substrate 10.

Thereafter, a layer of undraped polysilicon material 14, generally less than 8000 Å (typically around 4000 Å), is deposited upon the upper surface of dielectric material 12. Deposition of polysilicon 14 (which after implantation and anneal becomes a conductive material) is achieved by any conventional methodology including, for example, low pressure chemical vapor deposition (CVD).

A preferred conductive material 14 includes polycrystalline silicon (polysilicon) having relatively large grain size. Larger grain size implies fewer boundaries between adjacent grains and therefore lower resistivity due to a lesser number of boundaries present for trapping mobile carriers. Grain boundaries also lend themselves to receiving dopant impurities and enhancing diffusion along the boundaries. Grain boundaries allow segregation of the impurities thereby rendering them electrically inactive at the boundary locations. Accordingly, one must take into account the dissimilarities between polysilicon and the single crystal structure, normally found in substrate 10, when implanting impurities therein. Also, one must carefully maintain germanium (Ge) ion within the implant mechanism in close tolerance. To do so requires that arsenic (As), which is sometimes sent with germanium due to the relative similarity of Ge and As atomic mass, be sputter cleaned or removed from the implant chamber.

As shown in FIG. 1, once polysilicon 14 is formed across the entire wafer surface, Ge ions are implanted into the polysilicon without requiring a masking step. As used herein, Ge ions provide a diffusion barrier against subsequent impurity diffusion within polysilicon 14. In order for the barrier layer of Ge ions to properly function, a majority of the Ge ions must be placed at a specific depth within polysilicon 14 and within a fairly close depth range of each other. Ion implanters can oftentimes be carefully controlled such that the ions accelerated from the implanters will penetrate into the target a specified distance and that the narrow concentration of heavy mass ions so implanted exhibit a concentration peak (or gaussian curve) density within the implanted target. It is important to the present invention that the Ge ions be implanted having a normal or skewed gaussian curve with a relatively narrow standard deviation. The preferred range and standard deviation will be described in more detail below.

Figure 2:
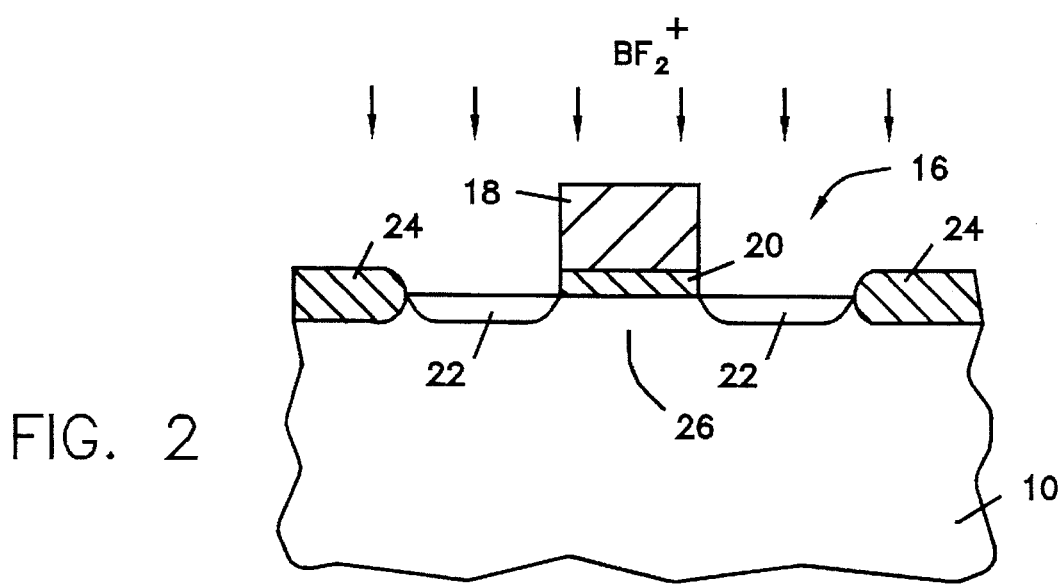
FIG. 2 is a cross-sectional view of a semiconductor substrate embodying a patterned PMOS device placed between field oxides and configured to receive $BF_2$ ions during a subsequent processing step according to the present invention.

Referring to FIG. 2, a subsequent processing step is shown wherein an active device or PMOS FET 16 is placed within and onto select areas of substrate 10. Active device or FET 16 is produced according to standard photolithography procedures. Namely, select regions of conductive material 14 and dielectric 12 are removed using photoresist (positive or negative photoresist) masking and etch techniques to produce a patterned gate conductor 18 immediately overlying gate oxide 20. Using a self-aligned process, source and drain regions 22 are thereafter implanted with a p+ type dopant (i.e., $BF_2$) between field oxides 24. Although implant solely of BF would normally present a problem of penetration through gate oxide 20 and into gate oxide conductor 20 and channel region 26, previously implanted Ge ions substantially prevent or retard the BF-derived dopant ions (or boron) from migrating or penetrating from gate 18 through gate oxide 20 and into channel 26. The depth to which Ge ions are implanted relative to the BF ions are described further below.

Figure 3:
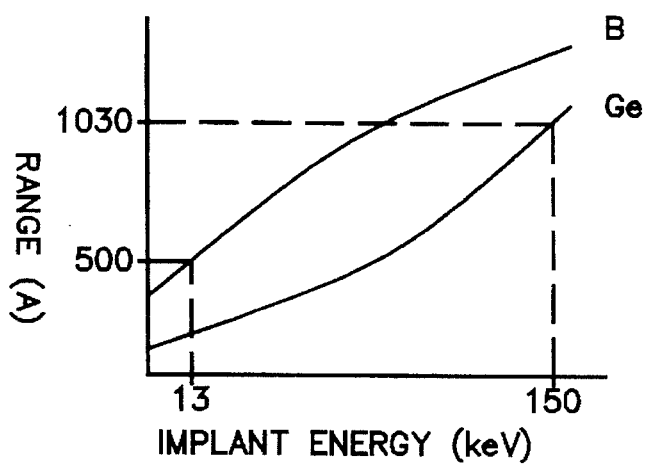
FIG. 3 is a graph illustrating the depth or range of implantation of dopants/impurities placed within a conductive gate material at various implant energies according to the present invention.

As shown in FIG. 3, different ions diffuse at different depths (or ranges) depending upon several factors. One factor determinative of implant depth is the atomic number or mass of the ion to be implanted. Still further, changes in the acceleration or implant energy of the ion implanter can also correspond to changes in range. FIG. 3 illustrates that boron as well as fluorine (i.e., the ionic compound of boron fluoride $BF_2$) can be implanted at greater ranges than Ge at the same implant energy. This is primarily due to Ge having a heavier atomic mass than $BF_2$ and the diffusivity by which Ge atoms move along grain boundaries and along the interstitial sites of the polycrystalline silicon. Precise implantation within a narrow standard deviation therefore requires knowledge of (i) relative atomic mass of the ions to the implanted, (ii) of the diffusion characteristics of ions having heavy and light atomic masses as described below and shown in FIG. 4, and (iii) the relative grain size of the polysilicon to be implanted, as described above. Exemplary implant energies and ranges for both B and Ge are shown in FIG. 3 and are described below.

Figure 4:
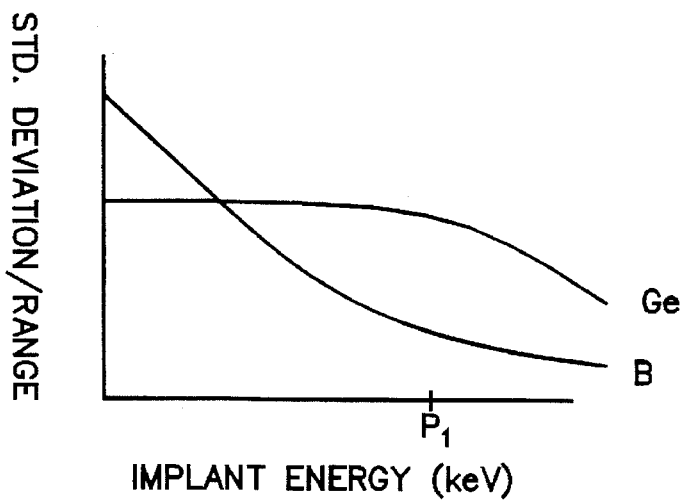
FIG. 4 is a graph illustrating concentration curve (standard deviation and range) of impurities placed within a conductive gate material at various implant energies according to the present invention.

Although $BF_2$ requires less energy to achieve a specified implant depth or range, the lighter atomic mass associated with $BF_2$ causes ions to be dispersed throughout the target at a wider standard deviation than heavier atomic mass ions such as Ge. As the curves in FIG. 4 illustrate, at lower implant energies (provided both impurities are provided at the same depth or range), $BF_2$ ions are diffused in a more scattered fashion and exhibit a wider standard deviation than Ge ions. As implant energy increases, standard deviation of the $BF_2$ ions increases less than the increase in range causing a narrower implant standard deviation at deeper implants. Conversely, Ge ions can be implanted at higher energies while maintaining an increase in standard deviation approximately equal the increase in depth or range, up to a critical implant energy amount, denoted as $P_1$. As such, Ge can be implanted to a much deeper depth than $BF_2$ while maintaining a fairly narrow standard deviation. Increase in depth can be readily achieved by merely increasing the ionizer implant energy. In self-aligned processes, $BF_2$ is generally implanted at low energies in order to produce shallow source/drain regions 22. Therefore, standard deviations are relatively high for $BF_2$-derived boron so placed. However, higher energy Ge ions remain closely packed or spaced at a deeper range within gate conductor 18.

Figure 5:
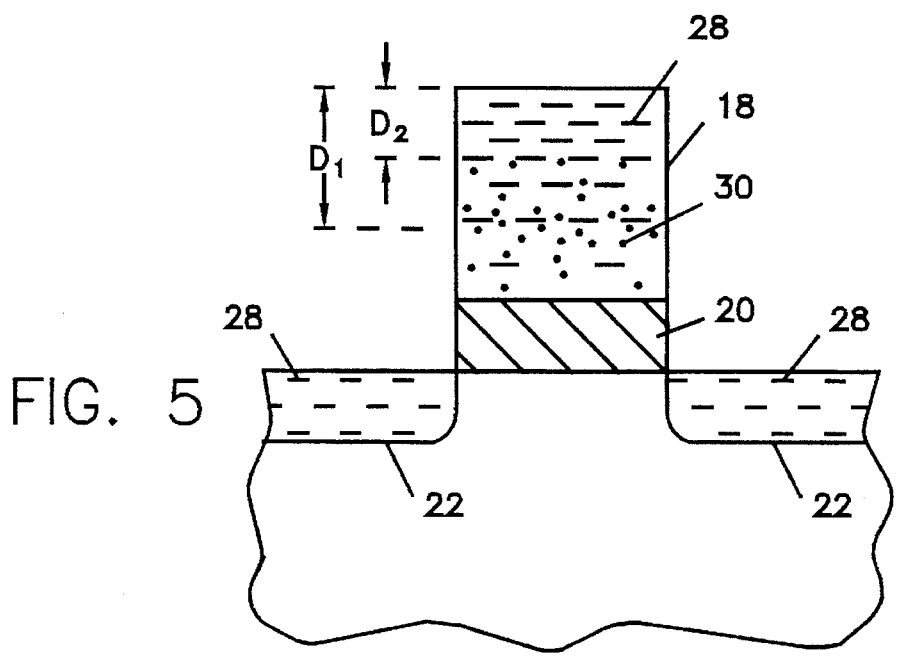
FIG. 5 is a further enlarged cross-sectional view of an active area having impurities placed therein according to the present invention.

FIG. 5 illustrates a more enlarged view of gate conductor 18 having $BF_2$ dopant 28 and Ge dopant 30 placed therein. A majority of Ge ions (or atoms) are shown placed at a deeper depth relative to the upper surface of conductive material 14 (or gate conductor 18) than the diffusion depth or range of $BF_2$ compound 28, comprising boron and fluorine atoms. Specifically Ge atoms 30 are implanted into the initial conductive material 14 to a concentration peak density at a first depth, $D_1$, relative to the upper surface of the conductive material, and $BF_2$ impurities 28 (B and F atoms) are implanted into the source and drain regions 22 simultaneous with implantation into gate conductor 18 to a concentration peak density at a second depth, $D_2$, within conductor 18. The second depth is purposefully shallower than the first depth.

Figure 6:
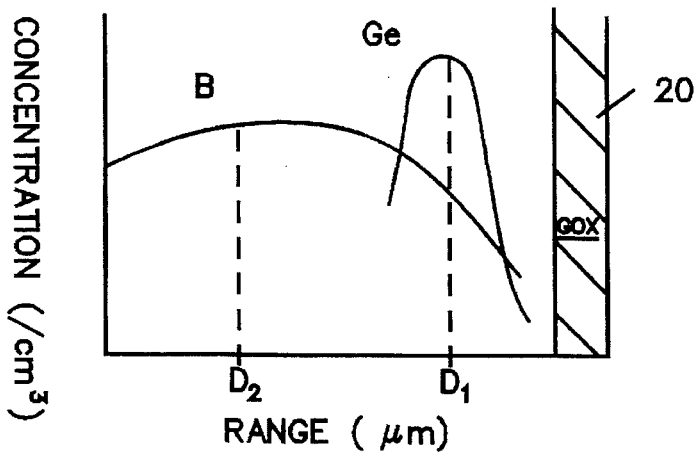
FIG. 6 is a graph illustrating concentration curve versus range of impurities placed within a conductive gate material according to the present invention.

As further illustrated in FIG. 6, the concentration of $BF_2$ atoms is illustrated as a function of implantation depth or range. Ge concentration is also shown as a function of range. As described above and further illustrated in FIG. 6, Ge atoms can be implanted at a greater depth while maintaining a narrower standard deviation than $BF_1$ atoms. Specifically $BF_2$ atoms can be implanted at a shallower depth by reducing the implant energy to ensure that a substantial portion (approximately greater than 80%) of the $BF_2$ atoms are implanted at a shallower depth within gate conductor 18 than the Ge atoms. In order to achieve precise diffusion depth under controlled concentrations, it is appreciated that a Ge dose within an exemplary range of $1 \times 10^{13} - 5 \times 10^{14}$ atoms/cm$^2$ and at an implant energy greater than 150 keY, be implanted at a concentration peak density at a depth preferably of approximately 1030 angstroms (Å) relative to the upper surface of gate conductor 18. Likewise, a suitable BF$_2$ dose within the range of $3\times10^{15}$–$8\times10^{15}$ atoms/cm$^2$ and at an implant energy equal to or less than 60 keV, can produce an exemplary boron concentration peak density of approximately 500 angstroms (Å). The concentration peak densities for both B and Ge shown in FIG. 6 are also shown relative to gate oxide 20, peak concentration of Ge being closer to gate oxide 20 than the peak concentration of B.

Figure 7:
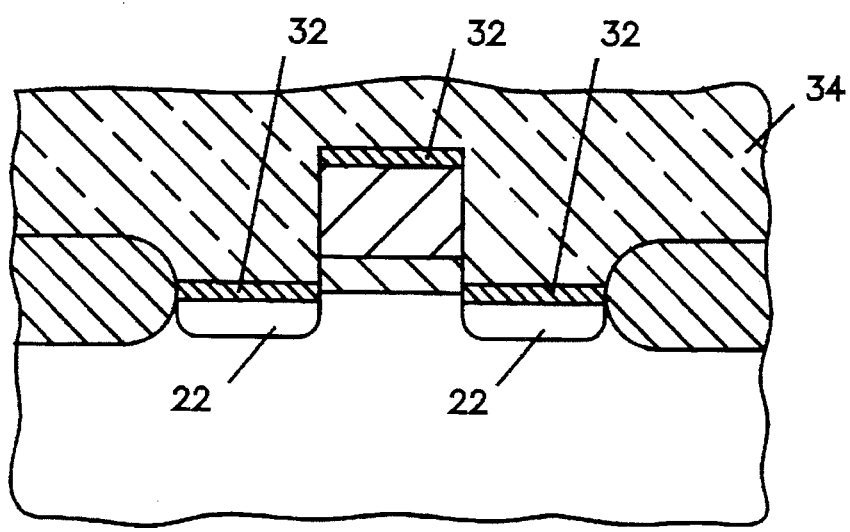
FIG. 7 is a cross-sectional view of a semiconductor substrate embodying a patterned PMOS device with silicide formation and overlying dielectric material formed according to the present invention.

An important advantage of the present processing methodology is the ability to grow silicide 32 at the upper surface of source/drain regions 22 and gate conductor 18 as shown in FIG. 7. It is commonly known that silicide 32 is formed by depositing a thin layer of metal (refractory metal) over exposed silicon and heating the wafer to a high enough temperature for the silicon and metal to react with one another. Subsequently, additional metallization is added which makes contact to the silicide in order to enhance ohmic connection at the silicide/metal interface. It is also well known that after ions or atoms are implanted into a crystal lattice such as polysilicon, certain implant-induced defects arise. The defects are caused by crystallographic damage, can be removed by annealing the implanted ions to their proper substitutional lattice sites. Annealing involves raising the temperature of the wafer to a level generally above 800° C. in order to rearrange the ions within in the lattice. It is further known that spin-on dielectric 34 or glass (often called organic silicates), can also be placed in liquid form across the upper topography of the wafer and possibly used as an interlevel insulator between several levels of conductors or levels of metallization. In order to cure the silicate, it must be heated to a substantial temperature generally between 600° C. and 900° C. in order to densify the material. A preferred silicate includes phosphosilicate glass (PPSG). Both PPSG and BPSG are well known and widely available in the industry.

Due to the necessity for heating the wafer in order to (i) anneal the polysilicon conductor 18, and (ii) reflow or cure glass 34, it is advantageous that both heating procedures occur simultaneously in order to reduce processing steps and reduce process time. Preferably, both heating procedures can occur during the final procedure of glass reflow. Thus, anneal can be postponed until the glass reflow operation, wherein a final or near final PMOS FET device having single or multi-layer can be formed. A near final PMOS FET device is shown in FIG. 7. The remaining steps of contact, metallization and passivation are well known to a skilled artisan in wafer processing art. For example, a single level metallization layer can be deposited upon the source/drain implant areas after BPSG is deposited. Thereafter, the BPSG undergoes reflow at the same time that the source/drain areas and gate conductor are annealed.

It will be appreciated to those skilled in the art having the benefit of this disclosure that this invention is believed to be capable of PMOS diffusion applications specifically using B$_2$ impurity dopant implant. Furthermore, it is also to be understood that the form of the invention shown and described is to be taken as a presently preferred embodiment. Various modifications and changes may be made without departing from the spirit and scope of the invention as set forth in the claims. It is intended that the following claims be interpreted to embrace all such modifications and changes.

What is claimed is:

1. A method for reducing diffusion of dopant from a patterned semiconductor gate conductor to an underlying channel region, the method comprising the steps of:

providing a semiconductor substrate and a first layer of dielectric material across one surface of the substrate;

providing a conductive material across the dielectric material, said conductive material having an upper and lower surface wherein the upper surface is exposed and the lower surface is adjacent the dielectric material;

implanting germanium into the conductive material to a concentration peak density at a first depth relative to the upper surface of said conductive material;

selectively removing a portion of the conductive material to present a patterned gate conductor, a source region and a drain region, said source and drain regions are spaced apart within said substrate by a channel region underlying the patterned gate conductor;

implanting a dopant material into the source and drain regions simultaneous with implanting dopant material into the patterned gate conductor to a concentration peak density at a second depth within said gate conductor, wherein the second depth is shallower than said first depth;

applying metal to said patterned gate conductor and said source and drain regions;

depositing in liquid form a second layer of dielectric material across the metal and the patterned gate conductor; and curing the second layer of dielectric material at a temperature sufficient to reflow the second layer of dielectric simultaneous with an anneal of the patterned gate conductor and the source and drain regions.

2. The method as recited in claim 1, wherein said semiconductor substrate is an n– type substrate and said dopant material consists of BF$_2$.

3. The method as recited in claim 1, wherein said metal comprises a refractory metal.

4. The method as recited in claim 1, wherein said curing step comprises heating the second layer of dielectric material to a temperature exceeding 800° C.

5. The method as recited in claim 1, wherein said step for implanting germanium comprises further steps of:

ionizing elemental germanium; and accelerating the germanium ions at a dose within the range of $1\times10^{13}$ atoms/cs$^2$ to $5\times10_{14}$ atoms/cs$^2$ at an implant energy greater than 150 keV, whereby the first depth is approximately 1030 Å.

6. The method as recited in claim 1, wherein said step for implanting dopant material comprises further steps of:

ionizing a compound of boron difluoride; and accelerating the ionized boron fluoride ions at a dose within the range of $3\times10^{15}$ atoms/cm$^2$ to $8\times10^{15}$ atoms/cm$^2$ at an implant energy less than 60 keV, whereby the second depth is approximately 500 Å.

7. A method for reducing diffusion of boron dopant from a patterned semiconductor gate conductor to an underlying n– type channel region, the method comprising:

providing a semiconductor n– type substrate and a first layer of dielectric material across one surface of the substrate;

providing a conductive material across the dielectric material, said conductive material having an upper and lower surface wherein the upper surface is exposed and the lower surface is adjacent the dielectric material;

implanting germanium into the conductive material via the exposed surface to a concentration peak density at a first depth relative to the upper surface of said conductive material, said first depth is substantially equal to 1030 Å;

selectively removing a portion of the conductive material and underlying dielectric material to present a source region, a drain region and a patterned gate conductor having a thickness substantially equal to said conductive material, said source and drain regions are spaced apart within said substrate by a channel region underlying the patterned gate conductor;

implanting ionized $BF_2$ into the source and drain regions simultaneous with implanting ionized $BF_2$ into the patterned gate conductor to a concentration peak density at a second depth within said gate conductor relative to the initial upper surface of said conductive material, said second depth is substantially equal to 500 Å;

applying metal to said patterned gate conductor and said source and drain regions;

depositing in liquid form a second layer of dielectric material across the metal and the patterned gate conductor; and curing the second layer of dielectric material at a temperature sufficient to simultaneously anneal the patterned gate conductor and the source and drain regions.

8. The method as recited in claim 7, wherein the step of implanting comprises implanting only ionizer $BF_2$.

9. The method as recited in claim 7, wherein said metal comprises a refractory metal.

10. The method as recited in claim 7, wherein said curing step comprises heating the second layer of dielectric material to a temperature exceeding 800° C.

11. The method as recited in claim 7, wherein said step for implanting germanium comprises further steps of:

ionizing elemental germanium; and accelerating the germanium ions at a dose within the range of $1\times10^{13}$ atoms/cm$^2$ to $5\times10^{14}$ atoms/cm$^2$ at an implant energy greater than 150 keV.

12. The method as recited in claim 7, wherein said step for implanting dopant material comprises further steps of:

ionizing a compound of boron difluoride; and accelerating the ionized boron difluoride ions at a dose within the range of $3\times10^{15}$ atoms/cm$^2$ to $8\times10^{15}$ atoms/cm$^2$ at an implant energy less than 60 keV.

13. A method for producing a boron dopant diffusion barrier in a semiconductor gate conductor, the method comprising the steps of:

providing a semiconductor substrate and a first layer of dielectric material onto said substrate and a conductive material onto said dielectric material;

implanting germanium ions diffusion barrier into said conductive material to a concentration peak density at a first depth;

selectively removing a portion of the conductive material and underlying dielectric material to present a patterned gate conductor spaced above said substrate and a source region and a drain region within said substrate, said source and drain regions are spaced apart within said substrate by a channel regions underlying the patterned gate conductor;

implanting $BF_2$ dopant ions into the source and drain regions simultaneous with implanting $BF_2$ dopant ions into the patterned gate conductor to a concentration peak density at a second depth, wherein said second depth is shallower than said first depth; and heating the substrate at a temperature sufficient to anneal the patterned gate conductor, whereby a barrier is formed by said germanium ions and the barrier remains between at least 80% of said $BF_2$ ions within said patterned gate conductor and said channel region.

14. The method as recited in claim 13, wherein said step for implanting germanium comprises further steps of:

ionizing elemental germanium; and accelerating the germanium ions at a dose within the range of $1\times10^{13}$ atoms/cm$^2$ to $5\times10^{14}$ atoms/cm$^2$ at an implant energy greater than 150 keV, whereby the first depth is approximately 1030 Å.

15. The method as recited in claim 13, wherein said step for implanting dopant material comprises further steps of:

ionizing a compound of boron difluoride; and accelerating the ionized boron difluoride ions at a dose within the range of $3\times10^{15}$ atoms/cm$^2$ to $8\times10^{15}$ atoms/cm$^2$ at an implant energy less than 60 keV, whereby the second depth is approximately 500 Å.

\* \* \* \* \*